(12) United States Patent
Sinha et al.

(10) Patent No.: US 12,261,568 B2
(45) Date of Patent: Mar. 25, 2025

(54) CONTROLLED APPLICATION OF HYSTERESIS IN CRYSTAL OSCILLATOR CIRCUITS

(71) Applicant: NXP USA, Inc., Austin, TX (US)

(72) Inventors: Anand Kumar Sinha, Noida (IN); Siyaram Sahu, Bari Raisen (IN); Ateet Omer, Kanpur (IN); Vishwajit Babasaheb Bugade, Kolhapur (IN); Harish Eleendram, Tirupati (IN); Nagaraju Sunkara, Guntur (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/509,047

(22) Filed: Nov. 14, 2023

(65) Prior Publication Data
US 2024/0405721 A1  Dec. 5, 2024

(30) Foreign Application Priority Data
Jun. 5, 2023   (IN) .............................. 202311038562

(51) Int. Cl.
*H03B 5/36* (2006.01)
*H03B 5/06* (2006.01)
*H03K 3/037* (2006.01)

(52) U.S. Cl.
CPC ............... *H03B 5/364* (2013.01); *H03B 5/06* (2013.01); *H03K 3/0377* (2013.01)

(58) Field of Classification Search
CPC ......... H03B 5/364; H03B 5/06; H03K 3/0377
See application file for complete search history.

(56) References Cited

U.S. PATENT DOCUMENTS

| | | | |
|---|---|---|---|
| 4,613,829 A * | 9/1986 | Ott | H03K 3/03 331/158 |
| 6,211,712 B1 | 4/2001 | Baik | |
| 7,057,468 B2 | 6/2006 | Wu et al. | |
| 7,554,414 B2 | 6/2009 | Christ | |
| 8,975,926 B2 | 3/2015 | Zhang et al. | |
| 2014/0300400 A1* | 10/2014 | Zhang | H03K 3/3565 327/298 |

OTHER PUBLICATIONS

"Low Noise Hysteretic Comparator ED —Darl Kuhn", ip.com Inc., IP.com No. IPCOM00261582D, ISSN: 1533-0001, West Henrietta, NY, US, Mar. 18, 2020, pp. 1-9.

* cited by examiner

*Primary Examiner* — Jeffrey M Shin

(57) ABSTRACT

Systems and methods for controlled application of hysteresis in crystal oscillator circuits are discussed. In various embodiments, an Integrated Circuit (IC) may include: an inverter comparator coupled to a crystal oscillator, where the inverter comparator is configured to: (i) receive an input of the crystal oscillator, and (ii) output a clock signal; and a hysteresis control circuit coupled to the inverter comparator, wherein the inverter comparator is configured to: (i) start up with hysteresis disabled, and (ii) enable hysteresis in response to a hysteresis enable signal provided by the hysteresis control circuit.

20 Claims, 8 Drawing Sheets

CONTROLLED APPLICATION OF HYSTERESIS IN CRYSTAL OSCILLATOR CIRCUITS

CROSS-REFERENCE TO RELATED APPLICATIONS

This application claims the priority under 35 U.S.C. § 119 of India application No. 202311038562, filed on 5 Jun 2023, the contents of which are incorporated by reference herein.

FIELD

This disclosure relates generally to electronic circuits, and more specifically, to systems and methods for controlled application of hysteresis in crystal oscillator circuits.

BACKGROUND

An oscillator is an electronic circuit that produces a periodic, Alternating Current (AC) signal—e.g., a sine, square, or triangle wave—based upon a Direct Current (DC) input received from a voltage supply. Oscillator circuits are used in many different types of electronic devices, including clock generators, digital instruments, computers, processors, peripherals, etc.

Among the various types of oscillators available, crystal oscillators are well-suited for use as reference clocks in System-on-Chips (SoCs), particularly in applications that have low-jitter requirements, such as Peripheral Component Interconnect Express (PCIe) and Serial Advanced Technology Attachment (SATA).

BRIEF DESCRIPTION OF THE DRAWINGS

The present invention(s) are illustrated by way of example and are not limited by the accompanying figures, in which like references indicate similar elements. Elements in the figures are illustrated for simplicity and clarity and have not necessarily been drawn to scale.

DETAILED DESCRIPTION

Figure 1:
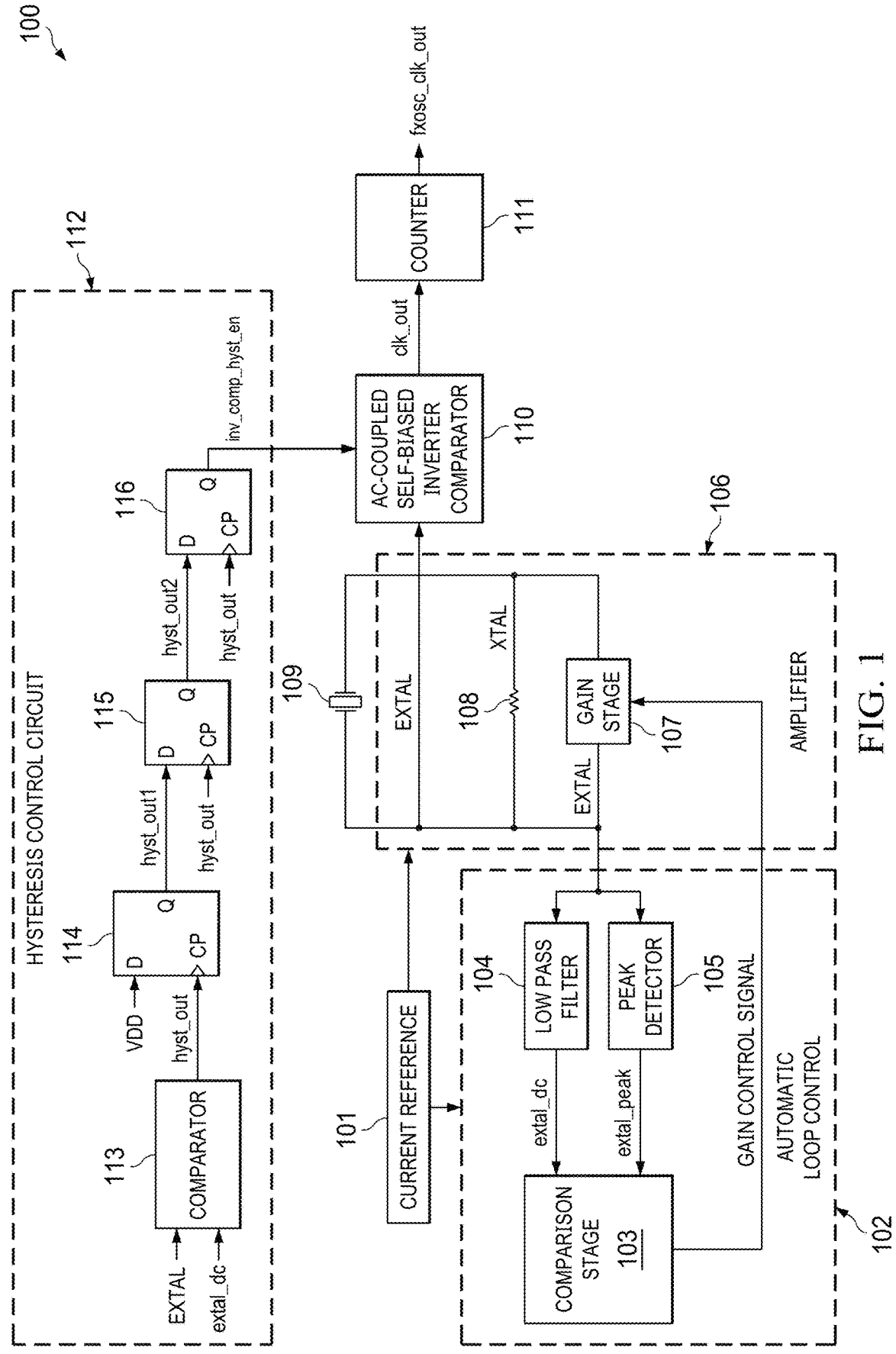
FIG. 1 is a diagram of an example of a crystal oscillator circuit, according to some embodiments.

An Integrated Circuit (IC) is an electronic circuit fabricated on a semiconductor material (e.g., silicon). Nowadays, modern semiconductor manufacturing processes enable an ever-increasing number of miniaturized transistors and other devices to be integrated into a single electronic package or "chip."

In that regard, a Systems-on-Chip (SoC) is a specific type of IC that includes most or all components of an entire computer or other electronic system. For example, typical SoC components may include Central Processing Units (CPUs), Graphics Processing Units (GPUs), memory interfaces, Input/Output (I/O) devices, radios, I/O interfaces, secondary storage interfaces, etc.

When designing an SoC, a common goal is to reduce the number of voltage supplies in each chip. If a voltage supply rail is shared across many other circuits within an SoC, however, jitter tends to increase and the use of hysteresis as a mitigation mechanism becomes important.

Within an SoC, one or more crystal oscillators may be used as reference clock(s). Each crystal oscillator includes an input (EXTAL) pin and an output (XTAL) pin, and both pins are connected to an inverter. Particularly in applications with low-jitter requirements, the inverter may be an Alternating Current (AC)-coupled, self-biased inverter comparator.

The inventors hereof have recognized, however, that enabling hysteresis in an AC-coupled, self-biased inverter comparator upon start-up of a crystal oscillator hinders the growth of the oscillator's EXTAL signal, thus resulting in long start-up times.

To address these, and other issues, systems and methods described herein may provide a controlled application of hysteresis to an AC-coupled, self-biased inverter comparator in order to reduce a crystal oscillator's start-up time.

In various embodiments, these systems and methods may enable an EXTAL signal to grow at start-up without the hindrances that would otherwise be presented by the early application of hysteresis. Once the EXTAL signal has reached a selected level, hysteresis may be applied.

For example, a crystal oscillator circuit may include an Automatic Loop Control (ALC) circuit configured to initially provide higher gain during start-up (for a faster start-up time), and to subsequently reduce the gain to preserve power as the EXTAL/XTAL swing increases. In such implementations, a hysteresis control circuit may be coupled to the ALC circuit to detect the magnitude of the EXTAL signal.

In response to the EXTAL signal having reached a selected value, the hysteresis control circuit may enable the application of hysteresis to the AC-coupled, self-biased inverter comparator—at which point hysteresis no longer presents a hinderance the EXTAL signal's growth.

Once hysteresis is enabled, the output of the oscillator (e.g., a clock signal) may be deemed ready to use by its SOC after a selected count value (e.g., 50 count). As such, the systems and methods described herein provide the application of hysteresis in a manner that promotes a low noise, normal start-up of a crystal oscillator clock.

To illustrate the foregoing, FIG. 1 is a circuit diagram of oscillator circuit 100 according to some embodiments. In this example, oscillator circuit 100 is low-power crystal oscillator, although in other examples other types of oscillators may be used. Moreover, although output signal FXOSC_CLK_OUT is characterized as a clock signal, in other examples oscillator circuit 100 may provide different types of output signals.

As shown, oscillator circuit 100 includes current reference 101 coupled to ALC circuit 102. ALC circuit 102 is coupled to amplifier 106, which in turn is coupled to AC-coupled, self-biased inverter comparator ("inverter comparator") 110. Hysteresis control circuit 112, which in some implementations may be part of ALC circuit 102, is also coupled to inverter comparator 110.

In operation, current reference 101 provides a reference current to ALC circuit 102. ALC circuit includes comparison stage 103, which is configured to process a DC component of the EXTAL signal (EXTAL_DC) determined by low pass filter 104 and a peak value of the EXTAL signal (EXTAL_PEAK) determined by peak detector 105.

ALC circuit 102 receives the EXTAL signal from amplifier 106. Amplifier 106 includes gain stage 107, resistance 108, and crystal 109 coupled in parallel.

Amplifier circuit 106 also provides the EXTAL signal to inverter comparator 110, which in response produces a clock signal (CLK_OUT). Within inverter comparator 110, hysteresis is controllably enabled by hysteresis control circuit 112, for example, only after the EXTAL signal has grown to a selected value after power up.

Particularly, hysteresis control circuit 112 includes comparator 113 configured to receive EXTAL and EXTAL_DC, and to output a HYST_OUT signal once the magnitude of the EXTAL signal has reached a selected value. The HYST_OUT signal is coupled to the clock input of each of flip-flops 114-116.

Flip-flops 114-116 are coupled to each other in series, in a cascade fashion, with suitable set-up and hold times. The Q output of flip-flop 114 provides a HYST_OUT1 signal to the D input of flip-flop 115, and the Q output of flip-flop 115 provides a HYST_OUT2 signal to the D input of flip-flop 116.

In this embodiment, once three transitions are reached, the Q output of flip-flop 116 provides a hysteresis enabling signal (INV_COMP_HYST_EN) to inverter comparator 110. In other implementations, however, a different number of flip-flops may be used (e.g., for a different number of transitions, such as 5 or more).

The clock signal (CLK_OUT) produced by inverter comparator 110 is provided to counter 111. Counter 111 outputs FXOSC_CLK_OUT after a selected number of cycles (e.g., 50) to another circuit configured to receive it after start-up, such as a processor core in an SoC, or the like.

In various embodiments, oscillator circuit 100 may be fabricated on an integrated circuit (IC) wafer or die using one of the many IC process technologies. For example, oscillator circuit 100 may be integrated in a substrate or die manufactured from various semiconductor materials, such as Silicon (Si), Germanium (Ge), or Gallium arsenide (GaAs), using various technologies such as complementary metal-oxide semiconductor (CMOS), silicon on insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), enhancement/depletion mode (E/D-mode) pHEMT, etc.

In some deployments, oscillator circuit 100 may be part of a larger digital logic system. For instance, oscillator circuit 100 may be coupled to a power amplifier (PA) control system. In certain embodiments, all or part of the larger digital logic system including oscillator circuit 100 may be fabricated on a single chip. The single chip may be created using a single IC fabrication process or using multiple IC fabrication processes in combination.

For example, a digital logic chip containing oscillator circuit 100 may be integrated in a substrate or die manufactured from various semiconductor materials. Different subsystems may each be fabricated using a unique IC material or process, or set of IC materials and processes. Within a larger digital system, oscillator circuit 100 may be fabricated using one set of IC materials and processes, and another subsystem may be fabricated using a different set of IC materials and processes. In some implementations, oscillator circuit 100 may occupy less than 5% or 1% of the total chip area.

Figure 2:
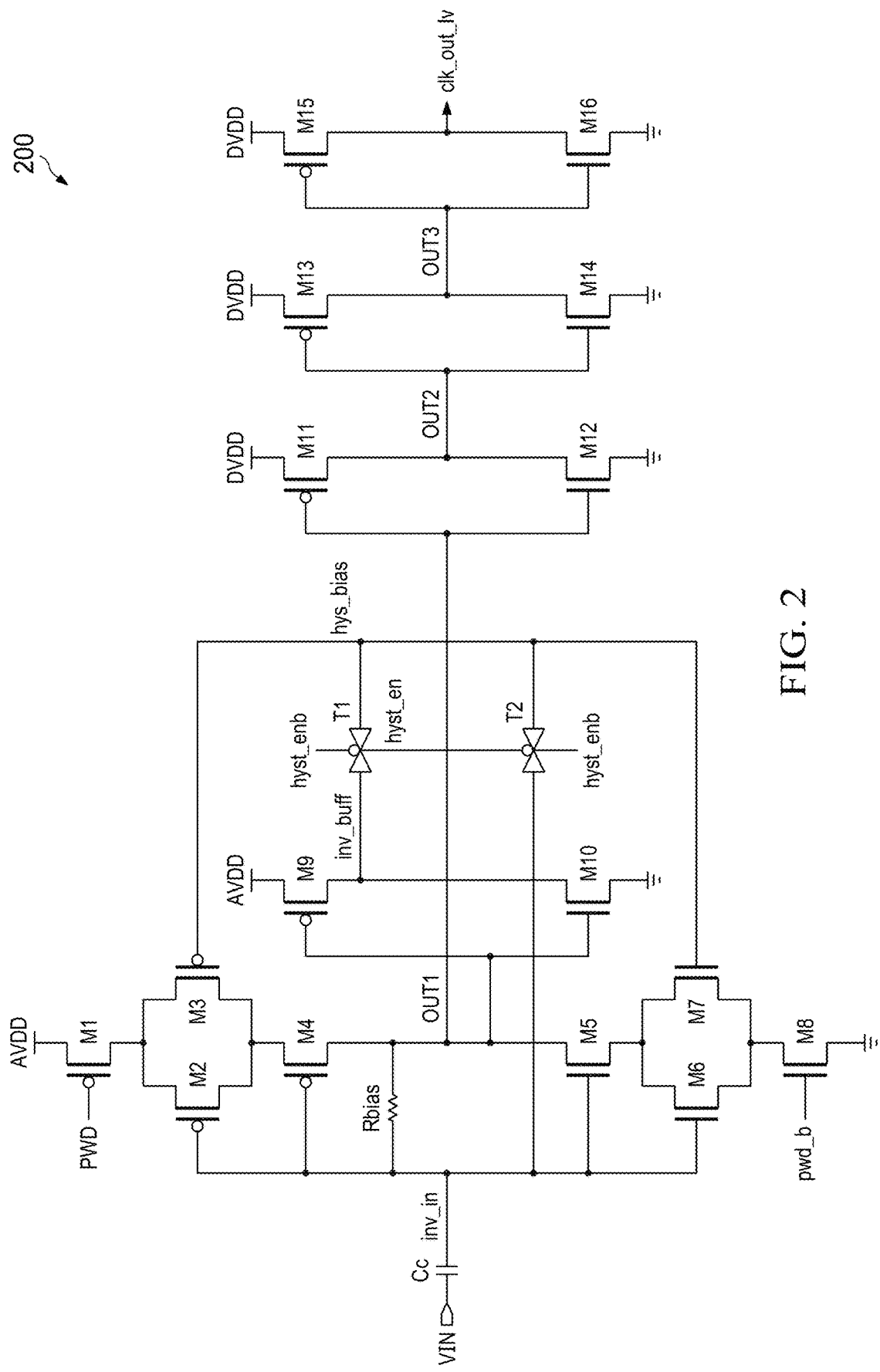
FIG. 2 is a diagram of an example of an Alternating Current (AC)-coupled, self-biased inverter comparator usable with the crystal oscillator circuit, according to some embodiments.

FIG. 2 is a diagram of an example of AC-coupled, self-biased inverter comparator 200, which may be used to implement circuit 110 of FIG. 1, according to some embodiments.

In this implementation, transistors M1, M2, M3, M4, M9, M11, M13, and M15 are P-type metal-oxide-semiconductor (PMOS) transistors, and transistors M5, M6, M7, M8, M10, M12, M14, and M16 are N-type MOS (NMOS) transistors. Capacitor Cc may have a capacitance of 16 pF and resistor $R_{bias}$ may have a resistance of 100 kΩ, for example, as reference for a 20 MHz to 40 MHz crystal oscillator 109.

AC coupled, self-biased inverter comparator 200 is connected to EXTAL. When node INV_IN is at logic 0, node OUT1 is at logic 1. Moreover, when hysteresis is enabled, transmission gate T1 is on and transmission gate T2 is off. So, HYS_BIAS is at logic 0. Both transistors M2 and M3 are on, and transistors M6 and M7 are off.

When node INV_IN is making its transition from 0 to 1, both PMOS transistors M2 and M3 are on. Accordingly, node INV_IN needs to go higher than supply voltage AVDD/2 to complete the transition and to switch node OUT1 from logic 1 to logic 0. Similarly, when node INV_IN is at logic 1, node OUT1 is at logic 0. When hysteresis is enabled, transmission gate T1 is on and transmission gate T2 is off. So, HYS_BIAS is at logic 1. Both transistors M6 and M7 are on, and transistors M2 and M3 are OFF.

When node INV_IN is making its transition from logic 1 to logic 0, both NMOS transistors M6 and M7 are on. Accordingly, node INV_IN needs to go lower than supply voltage AVDD/2 complete the transition and to switch node OUT1 from logic 0 to logic 1. The change in transition threshold voltage in each direction provides hysteresis to AC coupled, self-biased inverter comparator 200.

However, the change in load due to the application of hysteresis also provides an impediment to the growth of the EXTAL signal at smaller amplitudes. To address this, hysteresis control circuit 112 may be added to disable the hysteresis of inverter comparator 200 during start-up. When EXTAL grows to a certain value, as detected by hysteresis control circuit 112, hysteresis may be enabled. In this way, hysteresis does not impede the growth of the EXTAL signal, which in turn results in faster start-up times.

Figure 3A:
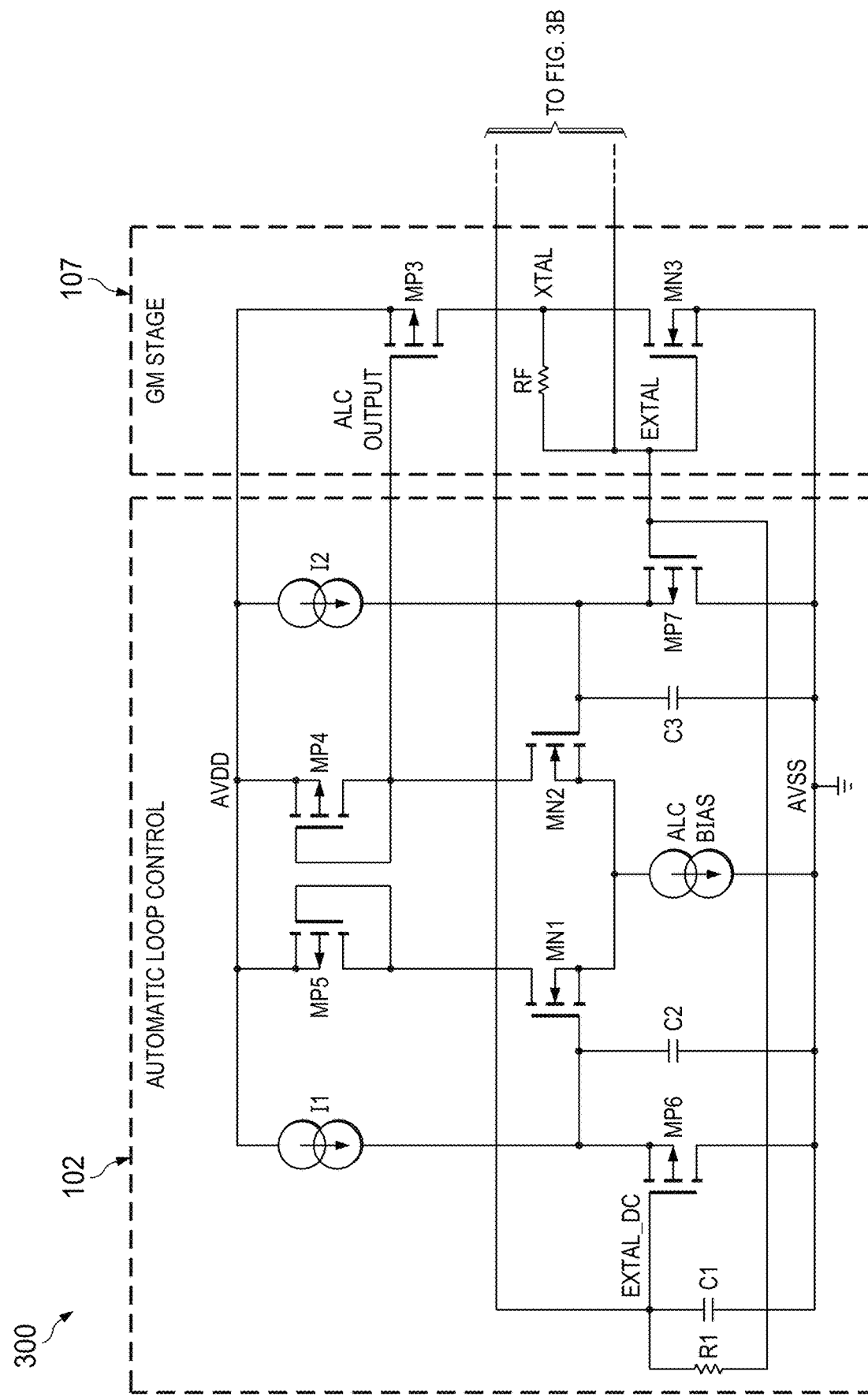
FIGS. 3A and 3B are diagrams of an example of a hysteresis control circuit usable with the crystal oscillator circuit, according to some embodiments.
Figure 3B:
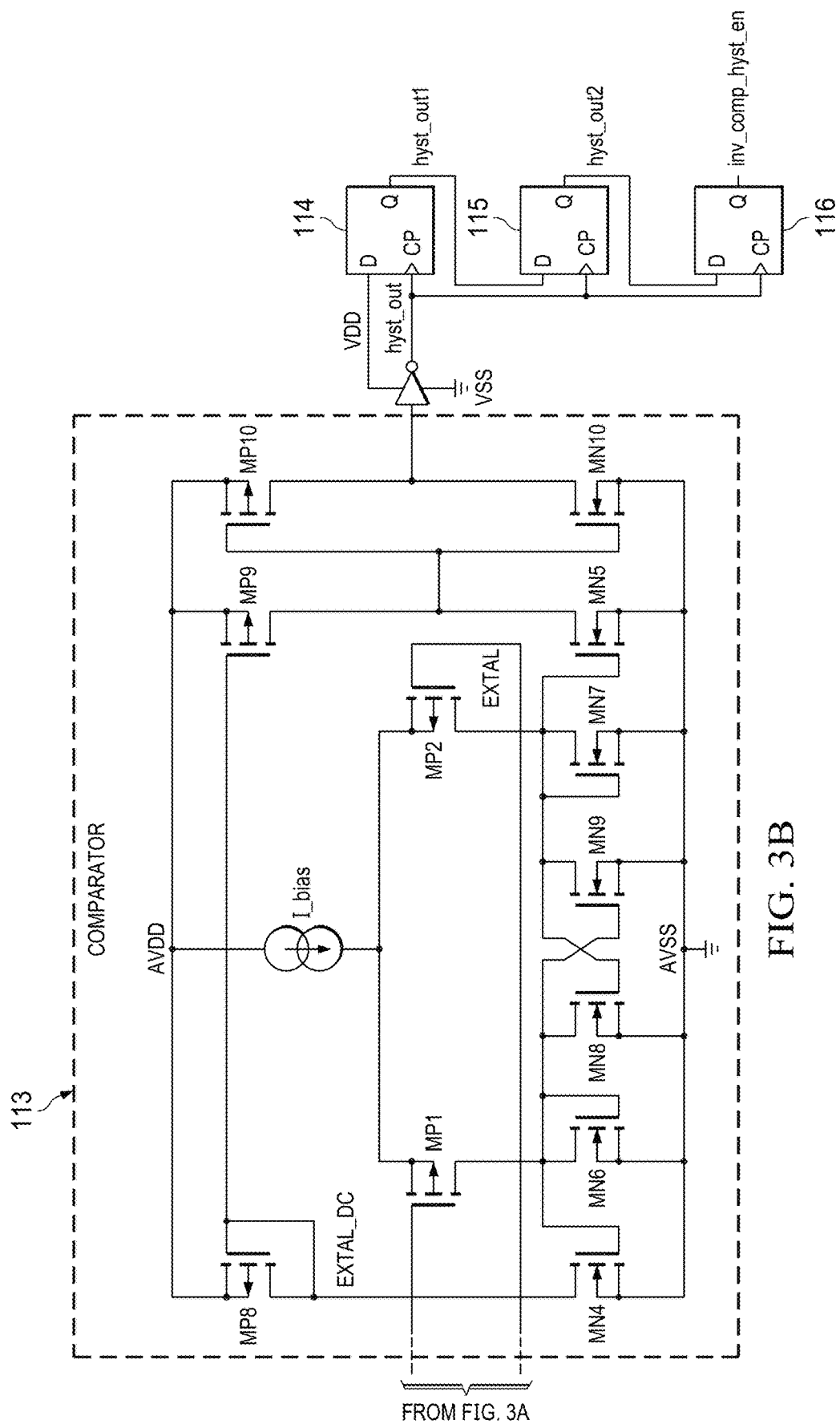

FIGS. 3A and 3B are diagrams of an example of hysteresis control circuit 300, which may be used to implement circuit 112 of FIG. 1, according to some embodiments. As shown, ALC circuit 102 is coupled to gain stage 107 of amplifier 106, gain stage 107 and ALC circuit 102 are coupled to comparator 113, and comparator 113 is coupled to flip-flops 114-116 via an inverter.

In this implementation, transistors MN1-MN10 are NMOS transistors and transistors MP1-MP10 are PMOS transistors. Also, I1, I2, ALC BIAS, and I_bias are current sources, C1-C3 are capacitors, and R1 and RF are resistors.

In operation, EXTAL from gain stage 107 and EXTAL_DC from ALC circuit 102 are the input signals for comparator 113. Comparator 113 may be a differential comparator (with its own hysteresis).

When the amplitude of the EXTAL signal grows to a selected value, the output of comparator 113 makes transitions; hence the HYST_OUT signal also makes transitions.

The HYST_OUT signal is coupled to the clock input of each of flip-flops 114-116. Once three rise transitions in HYST_OUT signal are completed (one transition per flip-flop 114-116), the Q output of flip-flop 116 provides a hysteresis enabling signal (INV_COMP_HYST_EN) to enable hysteresis in inverter comparator 200.

Figure 4:
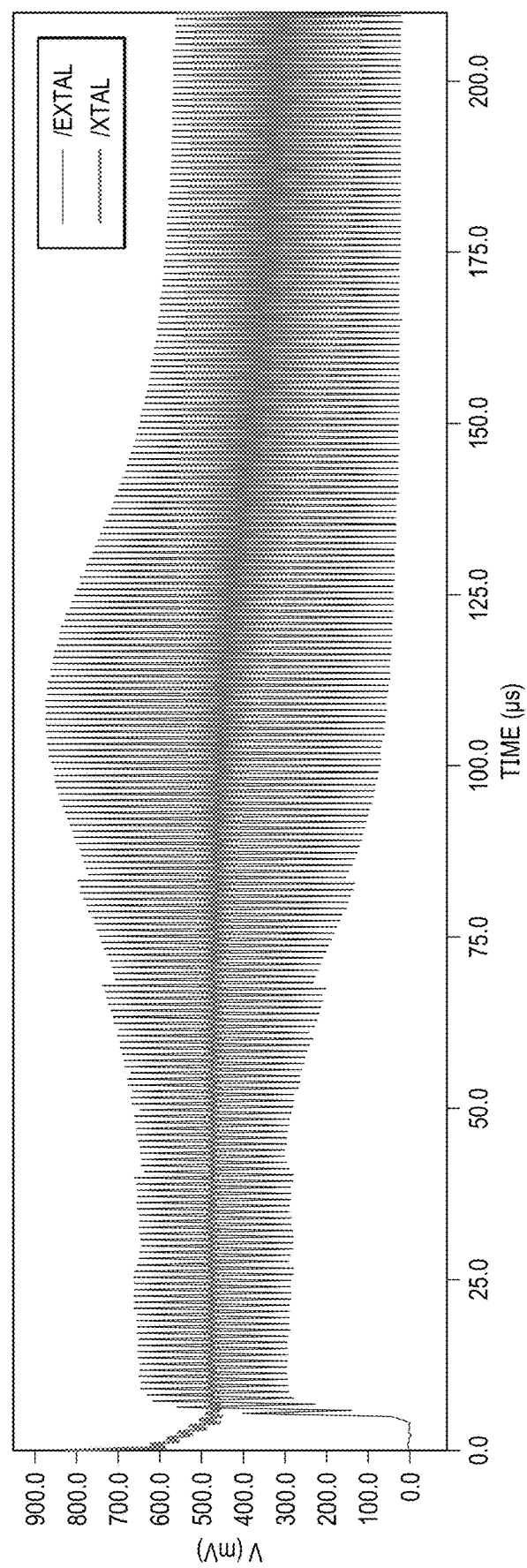
FIG. 4 is a graph showing hindered growth of an EXTAL signal due to early application of hysteresis in the AC-coupled, self-biased inverter comparator at start-up, which leads to longer start-up times ("Prior Art").

FIG. 4 shows graph 400 illustrating hindered EXTAL signal growth due to early application of hysteresis in an AC-coupled, self-biased inverter comparator (without hysteresis control circuit 112) at start-up, which leads to longer start-up times ("Prior Art"). Particularly, graph 400 shows that, when hysteresis in enabled at the outset, EXTAL and XTAL signals do not grow smoothly together upon start-up.

Figure 5:
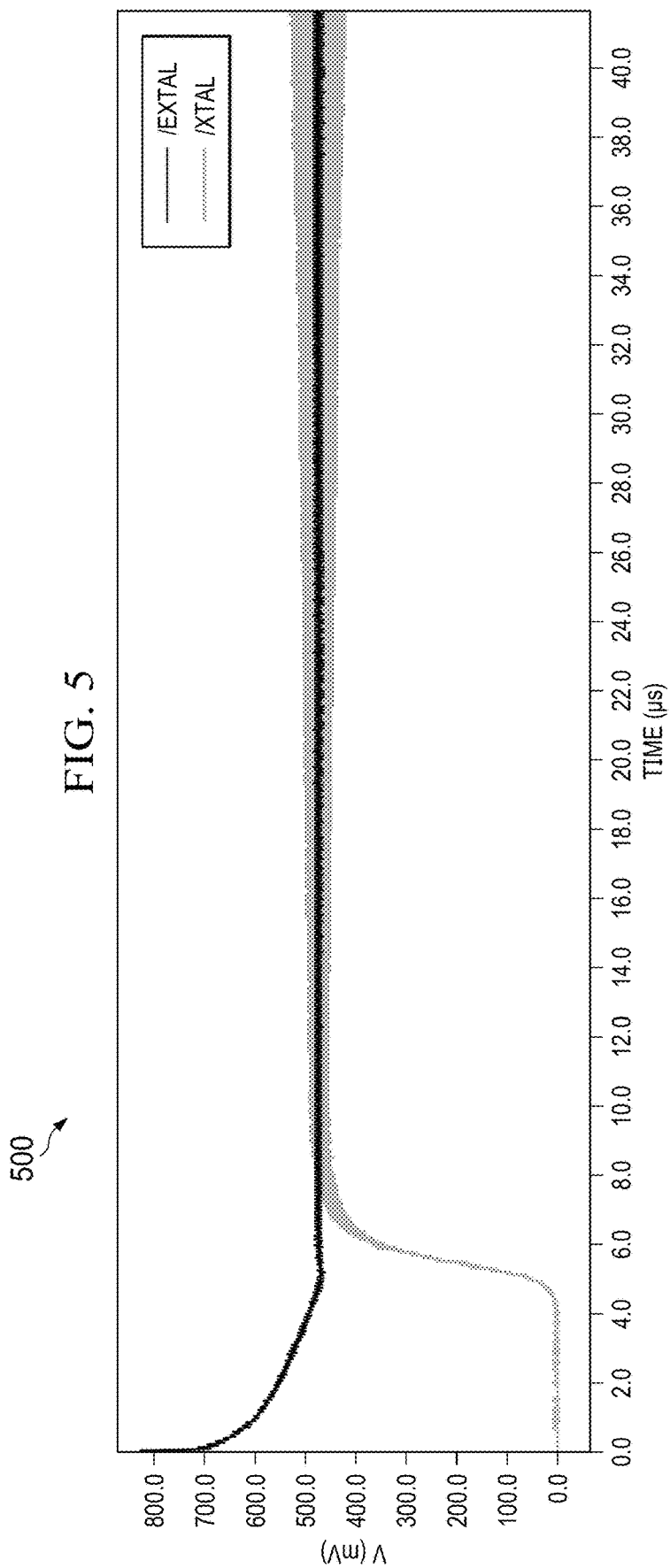
FIG. 5 is a graph showing unhindered growth of an EXTAL signal due to the later, controlled application of hysteresis in the AC-coupled, self-biased inverter comparator using the hysteresis control circuit to provide shorter start-up times, according to some embodiments.

In contrast, FIG. 5 shows graph 500 illustrating unhindered EXTAL signal growth due to the controlled application of hysteresis in AC-coupled, self-biased inverter comparator 200 (which includes hysteresis control circuit 112) to provide shorter start-up times, according to some embodiments. Specifically, graph 500 shows smooth growth between EXTAL and XTAL signals, compared to graph 400.

Figure 6:
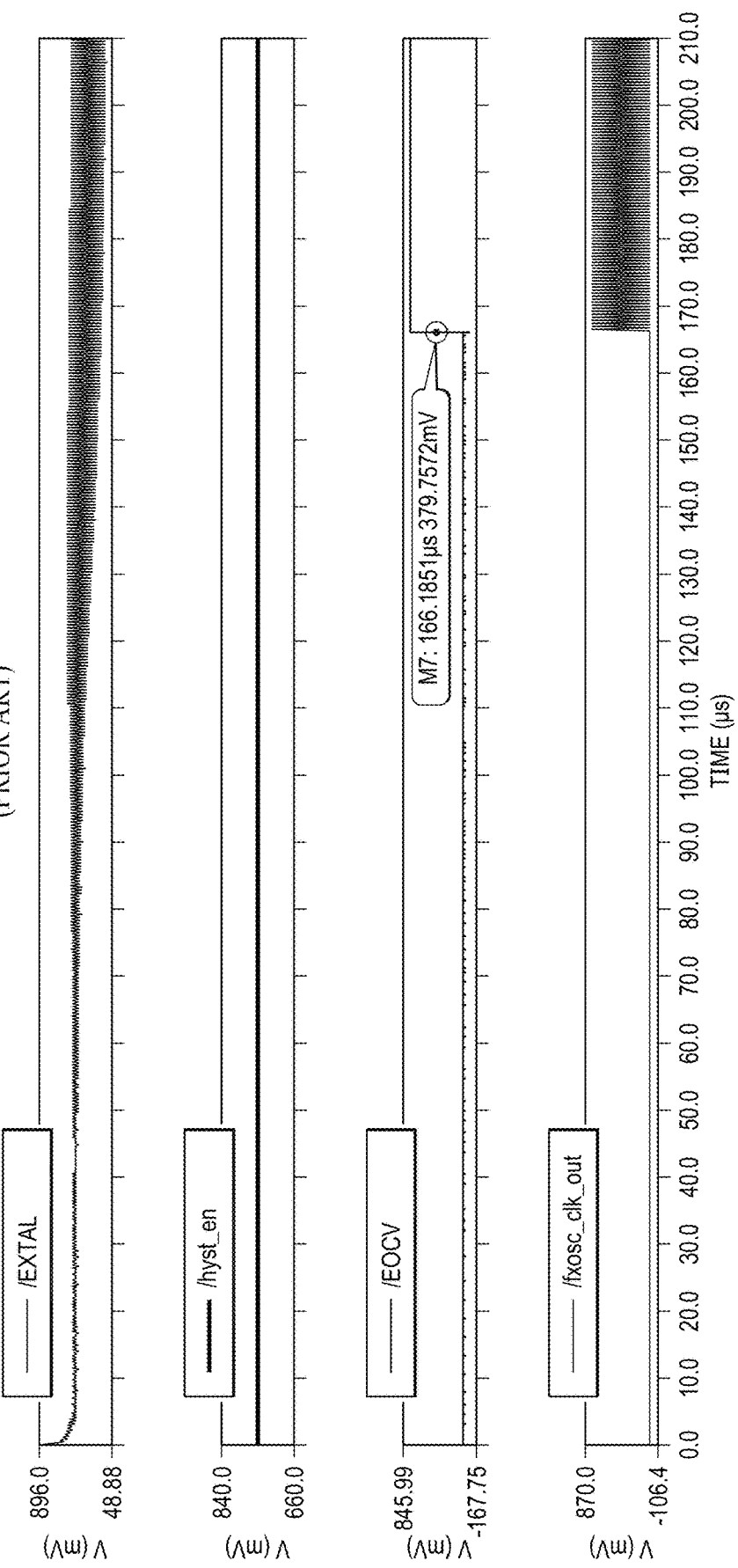
FIG. 6 is a graph showing the development of various signals in a crystal oscillator circuit when hysteresis is applied to the AC-coupled, self-biased inverter comparator at start-up ("Prior Art").

FIG. 6 shows graph 600 illustrating the development of various signals EXTAL, HYST_EN, End of Counter Value (EOCV), FXOSC_CLK_OUT and in crystal oscillator circuit 100 when hysteresis is applied to AC coupled, self-biased inverter comparator 200 at start-up ("Prior Art"). Particularly, FXOSC_CLK_OUT is output at approximately 166 µs.

Figure 7:
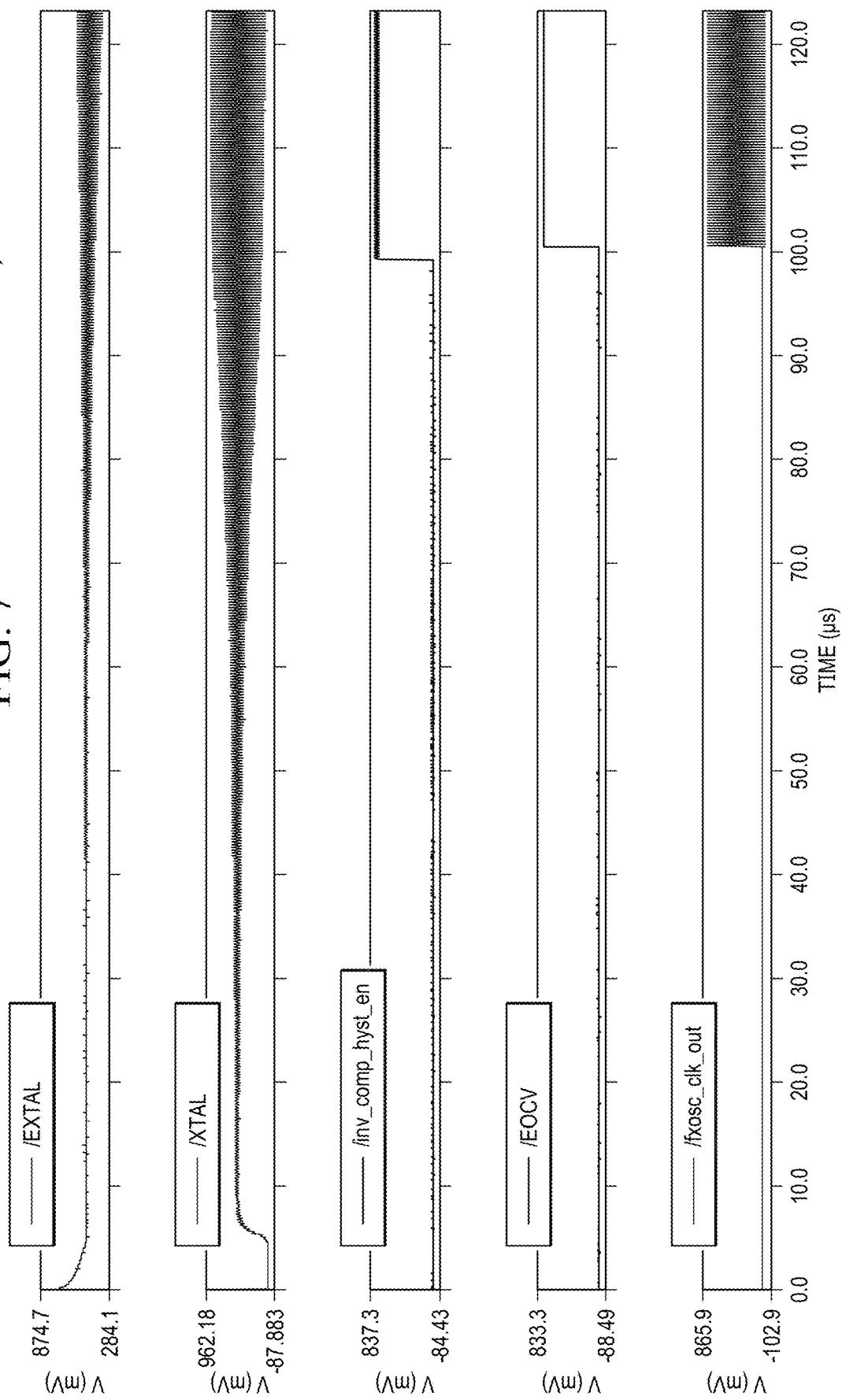
FIG. 7 is a graph showing the development of various signals in a crystal oscillator circuit when hysteresis is controllably applied to the AC-coupled, self-biased inverter comparator, according to some embodiments.

In contrast, FIG. 7 shows graph 700 illustrating the development of signals EXTAL, XTAL, HYST_EN, EOCV, FXOSC_CLK_OUT in crystal oscillator circuit 100 where hysteresis is controllably applied to AC-coupled, self-biased inverter comparator 200, according to some embodiments. Specifically, FXOSC_CLK_OUT is output at approximately 100 µs. As such, systems and methods described herein enable the output of circuit 100 significantly faster than shown in FIG. 6.

In an illustrative, non-limiting embodiment, an IC may include: an inverter comparator coupled to a crystal oscillator, where the inverter comparator is configured to: (i) receive an input of the crystal oscillator, and (ii) output a clock signal; and a hysteresis control circuit coupled to the inverter comparator, wherein the inverter comparator is configured to: (i) start up with hysteresis disabled, and (ii) enable hysteresis in response to a hysteresis enable signal provided by the hysteresis control circuit.

In some implementations, the inverter comparator may include an AC-coupled, self-biased inverter comparator. The hysteresis control circuit may include a comparator configured to: receive the input of the crystal oscillator; and output a control signal in response to the input of the crystal oscillator being equal to or greater than a selected value.

The hysteresis control circuit may include a plurality of flip-flops coupled in series. A first flip-flop among the plurality of flip-flops may be configured to receive the control signal. A last flip-flop among the plurality of flip-flops may be configured to provide the hysteresis enable signal. In some cases, the plurality of flip-flops may include three flip-flops.

The IC may include a counter coupled to an output of the inverter comparator. The counter may be configured to provide the clock signal to a processing core in an SoC after a predetermined number of cycles.

In another illustrative, non-limiting embodiment, an electronic device, may include an SoC and a clock circuit configured to provide a clock signal to the SoC, the clock circuit including: an AC-coupled, self-biased inverter comparator configured to: (i) receive an input of a crystal oscillator, and (ii) produce the clock signal; and a hysteresis control circuit coupled to the AC-coupled, self-biased inverter comparator, wherein the hysteresis control circuit is configured to enable hysteresis in the AC-coupled, self-biased inverter comparator in response to the input of the crystal oscillator being equal to or greater than a selected value.

In some implementations, the hysteresis control circuit may include a comparator configured to determine when the input of the crystal oscillator becomes equal to or greater than a selected value. The hysteresis control circuit may also include a plurality of cascaded flip-flops.

Among the plurality of cascaded flip-flops, a first flip-flop may be configured to receive an output from the comparator and a last flip-flop may be configured to enable hysteresis in the AC-coupled, self-biased inverter comparator. In some cases, the plurality of cascaded flip-flops may include three flip-flops.

The electronic device may include a counter coupled to an output of the AC-coupled, self-biased inverter comparator. The counter may be configured to provide the clock signal to the SoC in response to a predetermined number of cycles.

In yet another illustrative, non-limiting embodiment, a method may include, in an oscillator circuit, disabling hysteresis in an AC-coupled, self-biased inverter comparator upon start-up, where the AC-coupled, self-biased inverter comparator is configured to receive an output form a crystal oscillator; and in response to the output of the crystal oscillator being equal to or greater than a selected value, enabling hysteresis in the AC-coupled, self-biased inverter comparator.

In some implementations, disabling hysteresis in the AC-coupled, self-biased inverter comparator at startup may allow the output of the crystal oscillator to grow faster than if hysteresis were enabled. The method may include providing an output of the AC-coupled, self-biased inverter comparator to a circuit within an SoC. The circuit may include a processing core.

In many implementations, systems and methods described herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, wearable devices, Internet-of-Things (IoT) devices, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

For sake of brevity, conventional techniques have not been described in detail herein. Furthermore, the connecting lines shown in the various figures contained herein have been intended to illustrate relationships (e.g., logical) or physical couplings (e.g., electrical) between the various elements. It should be noted, however, that alternative relationships and connections may be used in other embodiments. Moreover, circuitry described herein may be implemented either in silicon or another semiconductor material or alternatively by software code representation thereof.

Although the invention(s) are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation(s).

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

We claim:

1. An Integrated Circuit (IC), comprising:
    an inverter comparator coupled to a crystal oscillator, wherein the inverter comparator is configured to: (i) receive an input of the crystal oscillator, and (ii) output a clock signal; and
    a hysteresis control circuit coupled to the inverter comparator, wherein the inverter comparator is configured to: (i) start up with hysteresis disabled, and (ii) enable hysteresis in response to a hysteresis enable signal provided by the hysteresis control circuit.

2. The IC of claim 1, wherein the inverter comparator comprises an Alternating Current (AC)-coupled, self-biased inverter comparator.

3. The IC of claim 1, wherein the hysteresis control circuit comprises a comparator configured to:
    receive the input of the crystal oscillator; and
    output a control signal in response to the input of the crystal oscillator being equal to or greater than a selected value.

4. The IC of claim 1, wherein the hysteresis control circuit further comprises a plurality of flip-flops coupled in series.

5. The IC of claim 4, wherein a first flip-flop among the plurality of flip-flops is configured to receive the control signal.

6. The IC of claim 4, wherein a last flip-flop among the plurality of flip-flops is configured to provide the hysteresis enable signal.

7. The IC of claim 4, wherein the plurality of flip-flops comprises three flip-flops.

8. The IC of claim 1, further comprising a counter coupled to an output of the inverter comparator.

9. The IC of claim 8, wherein the counter is configured to provide the clock signal to a processing core in a Systems-on-Chip (SoC) after a predetermined number of cycles.

10. An electronic device, comprising:
    a Systems-on-Chip (SoC); and
    a clock circuit configured to provide a clock signal to the SoC, the clock circuit further comprising:
        an Alternating Current (AC)-coupled, self-biased inverter comparator configured to: (i) receive an input of a crystal oscillator, and (ii) produce the clock signal; and
        a hysteresis control circuit coupled to the AC-coupled, self-biased inverter comparator, wherein the hysteresis control circuit is configured to enable hysteresis in the AC-coupled, self-biased inverter comparator in response to the input of the crystal oscillator being equal to or greater than a selected value.

11. The electronic device of claim 10, wherein the hysteresis control circuit further comprises a comparator configured to determine when the input of the crystal oscillator becomes equal to or greater than a selected value.

12. The electronic device of claim 11, wherein the hysteresis control circuit further comprises a plurality of cascaded flip-flops.

13. The electronic device of claim 12, wherein among the plurality of cascaded flip-flops a first flip-flop is configured to receive an output from the comparator and a last flip-flop is configured to enable hysteresis in the AC-coupled, self-biased inverter comparator.

14. The electronic device of claim 12, wherein the plurality of cascaded flip-flops comprises three flip-flops.

15. The electronic device of claim 12, further comprising a counter coupled to an output of the AC-coupled, self-biased inverter comparator.

16. The electronic device of claim 12, wherein the counter is configured to provide the clock signal to the SoC in response to a predetermined number of cycles.

17. A method, comprising:
    in an oscillator circuit, disabling hysteresis in an Alternating Current (AC)-coupled, self-biased inverter comparator upon start-up, wherein the AC-coupled, self-biased inverter comparator is configured to receive an output form a crystal oscillator; and
    in response to the output of the crystal oscillator being equal to or greater than a selected value, enabling hysteresis in the AC-coupled, self-biased inverter comparator.

18. The method of claim 17, wherein disabling hysteresis in the AC-coupled, self-biased inverter comparator at startup allows the output of the crystal oscillator to grow faster than if hysteresis were enabled.

19. The method of claim 17, further comprising providing an output of the AC-coupled, self-biased inverter comparator to a circuit within a Systems-on-Chip (SoC).

20. The method of claim 19, wherein the circuit comprises a processing core.

* * * * *